US010044183B2

(12) United States Patent
Wendt

(10) Patent No.: US 10,044,183 B2
(45) Date of Patent: Aug. 7, 2018

(54) DC POWER DISTRIBUTION SYSTEM

(71) Applicant: PHILIPS LIGHTING HOLDING B.V., Eindhoven (NL)

(72) Inventor: Matthias Wendt, Würselen (DE)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 194 days.

(21) Appl. No.: 14/905,872

(22) PCT Filed: Jul. 2, 2014

(86) PCT No.: PCT/EP2014/064007
§ 371 (c)(1),
(2) Date: Jan. 18, 2016

(87) PCT Pub. No.: WO2015/007523
PCT Pub. Date: Jan. 22, 2015

(65) Prior Publication Data
US 2016/0172851 A1    Jun. 16, 2016

(30) Foreign Application Priority Data
Jul. 18, 2013 (EP) ..................................... 13176982

(51) Int. Cl.
*H01F 27/42* (2006.01)
*H02J 1/00* (2006.01)
(Continued)

(52) U.S. Cl.
CPC ................ *H02J 1/00* (2013.01); *G01R 19/14* (2013.01); *G01R 31/043* (2013.01); *F21S 8/061* (2013.01);
(Continued)

(58) Field of Classification Search
CPC ..... H02H 11/002; H02H 3/003; H02J 7/0034; H02J 1/00; G01R 31/043; G01R 19/14
See application file for complete search history.

(56) References Cited

U.S. PATENT DOCUMENTS

2004/0055780 A1  3/2004  Hakkarainen et al.
2008/0090432 A1  4/2008  Patterson et al.
(Continued)

FOREIGN PATENT DOCUMENTS

CN    202338851 U    7/2012
EP      2053718 A2    4/2009
(Continued)

*Primary Examiner* — Daniel Cavallari
(74) *Attorney, Agent, or Firm* — Meenakshy Chakravorty

(57) ABSTRACT

The invention relates to a DC power distribution system (1) comprising a power supply (50) for supplying DC power to an electrical device (11) like a luminaire, wherein the system includes a connection device (4) comprising a connection device contact (5) to which an electrical device contact (19) of the electrical device is to be connected, a load presence detection unit (7) for detecting whether the electrical device contact has been connected, and a power providing control unit (6) for providing the DC power of the DC power distribution system to the connection device contact, only if the load presence detection unit has detected that the electrical device contact of the electrical device has been connected to the connection device contact. Thus, a voltage is not applied to the connection device contact, if the electrical device is not connected, thereby reducing corrosion effects and the likelihood of installers getting electrified.

14 Claims, 4 Drawing Sheets

(51) Int. Cl.
  *G01R 19/14* (2006.01)
  *H02J 7/00* (2006.01)
  *G01R 31/02* (2006.01)
  *G01R 31/04* (2006.01)
  *F21S 8/06* (2006.01)
  *F21V 23/04* (2006.01)

(52) U.S. Cl.
  CPC ........ *F21V 23/0471* (2013.01); *G01R 31/026* (2013.01); *G01R 31/045* (2013.01); *H02J 7/0034* (2013.01)

(56) References Cited

U.S. PATENT DOCUMENTS

| | | | |
|---|---|---|---|
| 2009/0174413 A1* | 7/2009 | Bucella | G01R 31/041 324/511 |
| 2009/0237011 A1 | 9/2009 | Shah et al. | |
| 2010/0130055 A1 | 5/2010 | Liang et al. | |
| 2010/0283623 A1 | 11/2010 | Baxter et al. | |
| 2012/0153889 A1* | 6/2012 | Xie | H02J 7/0034 320/107 |
| 2016/0079776 A1* | 3/2016 | Iguchi | B60L 11/1812 320/134 |

FOREIGN PATENT DOCUMENTS

| | | | |
|---|---|---|---|
| EP | 2530807 A1 | 5/2012 | |
| EP | 2511600 A2 | 10/2012 | |

\* cited by examiner

DC POWER DISTRIBUTION SYSTEM

CROSS-REFERENCE TO PRIOR APPLICATIONS

This application is the U.S. National Phase application under 35 U.S.C. § 371 of International Application No. PCT/EP2014/064007, filed on Jul. 2, 2014, which claims the benefit of European Patent Application No. 13176982.0, filed on Jul. 18, 2013. These applications are hereby incorporated by reference herein.

FIELD OF THE INVENTION

The invention relates to a DC power distribution system comprising a power supply for supplying DC power to be distributed and a connection device for electrically connecting an electrical device to the power supply. The invention relates further to the connection device, the electrical device and a DC power providing method and computer program for providing DC power of the DC power distribution system to the electrical device.

BACKGROUND OF THE INVENTION

US 2009/237011 A1 discloses a lighting system comprising an illumination device with a luminary module and an identification circuit. The lighting system further comprises a fixture device with a driver module and a controller module, wherein the illumination device is detachably connected to the fixture device, the driver module is configured to supply power to the luminary module and the controller module is configured to communicate with the identification circuit of the illumination device to retrieve data and to control the driver module according to the data.

Known DC power distribution systems installed at a ceiling of a room comprise electrical contacts to which electrical devices like luminaires can be electrically connected such that they receive DC power. Over time the electrical contacts corrode, which can lead to a reduced performance of the DC power distribution system.

SUMMARY OF THE INVENTION

It is an object of the present invention to provide a DC power distribution system comprising a power supply for supplying DC power to an electrical device, wherein the performance of the DC power distribution system can be increased. It is a further object of the present invention to provide a DC power providing method and computer program for providing DC power of the DC power distribution system, which allow for an increased performance of the DC power distribution system.

In a first aspect of the present invention a DC power distribution system comprising a power supply for supplying DC power to an electrical device is presented, wherein the system includes unipolar connection devices for electrically connecting the electrical device to the power supply, wherein a unipolar connection device comprises:

a connection device contact to which an electrical device contact of the electrical device is to be connected, a load presence detection unit for detecting whether the electrical device contact of the electrical device has been connected to the connection device contact, a polarity determining unit for determining the polarity of the electrical device contact of the electrical device, a power providing control unit for providing the DC power of the DC power distribution system to the connection device contact, only if the load presence detection unit has detected that the electrical device contact of the electrical device has been connected to the connection device contact, and for providing the DC power with the determined polarity.

Since the load presence detection unit detects whether the electrical device contact of the electrical device has been connected to the connection device contact, wherein only in this case the power providing control unit provides the DC power of the DC power distribution system to the connection device contact, in situations, in which the connection device contact is not connected to an electrical device contact of an electrical device, a voltage is not applied to the connection device contact, thereby reducing the likelihood of a generally possible corrosion of the connection device contact over time. Since the corrosion of the connection device contact over time can be reduced, the performance of the DC power distribution system can be increased. Moreover, since, when the electrical device contact of the electrical device is not connected with the connection device contact, a voltage is not applied to the connection device contact, the likelihood of installers getting electrified can be reduced. Moreover, since the electrical device can be connected to the DC power distribution system always with the correct polarity, without requiring the installer to take care of the polarity, the installation of the electrical device can be simplified.

For connecting the electrical device contact of the electrical device with the connection device contact of the connection device known connection elements can be used like cables, electrical connectors, et cetera. Preferentially, the power supply is connected to the electrical device via an electrical conductor like a power bus bar conducting the supplied power to the connection device and an electrical conductor like a cable forwarding the power from the connection device to the electrical device.

Preferentially, the connection device is adapted such that, if the load presence detection unit has detected that the electrical device has not been connected to the connection device contact, the connection device contact is connected to ground.

The electrical device is preferentially a luminaire such that the DC power distribution system with the connected luminaire can be regarded as forming a lighting system. The electrical device can also be a suspended ceiling module equipped with one or several luminaires, which may be regarded as being a lighting cloud. One or several electrical devices can be connected to the DC power distribution system. The connection device can be embedded in a ceiling, wherein the connection device contact of the connection device is accessible, in order to allow an installer to connect the electrical device to the connection device contact.

It is preferred that the load presence detection unit is adapted to apply a detection test voltage to the connection device contact, to measure a resulting detection test current and to detect whether the electrical device has been connected to the connection device contact based on the measured detection test current. In particular, the load presence detection unit can be adapted to apply voltage pulses to the connection device contact, especially short pulses of low voltage, for instance, 10 ms pulses of 5 V. Correspondingly, the load presence detection unit can be adapted to measure current pulses and to determine whether the electrical device has been connected to the connection device contact based on the measured current pulses. The load presence detection unit can be adapted to detect whether the electrical device has been connected to the connection device contact by comparing the measured current with one or several predefined currents, which would be expected, if the electrical device is connected to the connection device contact. For instance, the electrical device can have an identification resistor resulting in a certain detection test current, when applying the test detection voltage, wherein it can be detected that the electrical device has been connected, if the certain detection test current is measured. This allows reliably detecting whether an electrical load has been connected or not in a technically relatively simple way.

It is further preferred that the polarity determining unit is adapted to measure a polarity test current and to determine the polarity of the electrical device contact of the electrical device depending on the measured polarity test current. In particular, the polarity determining unit is adapted to apply a polarity test voltage to the connection device contact and to measure the polarity test current, when the polarity test voltage is applied. For instance, if the electrical device has two electrical device contacts for being connected to the DC power distribution system, wherein a first electrical device contact should be connected to ground and a second electrical device contact should be connected to a DC voltage conducting element of the DC power distribution system, and if the polarity test voltage is applied to the second electrical device contact, at the first electrical device contact and at the second electrical device contact polarity test currents may be measured, thereby indicating that the first electrical device contact should be connected to ground and the second electrical device contact should be connected to the DC voltage. In this example at the first electrical device contact the polarity test current may flow into the connection device and at the second electrical device contact the polarity test current may flow into the electrical device, i.e. with respect to the electrical device at the first and second electrical device contacts the polarity test current may flow in different directions and hence have different signs. The sign of the measured current may therefore be used for determining the polarity. If in this example the polarity test voltage is applied to the first electrical device contact, a polarity test current may not flow and hence not be measured, or only a very small polarity test current, which may be smaller than a predefined test current, may be measured. If this situation occurs, the polarity determining unit may determine that the polarity is such that the first electrical device contact should be connected to ground and the second electrical device contact should be connected to the DC voltage. Thus, the polarity determining unit can also be adapted to apply the polarity test voltage to the corresponding connection device contact and to determine the polarity based on the amount of the measured polarity test current. For example, if the polarity test current is larger than a predefined threshold, it can be determined that the DC voltage should be connected to the respective connection device contact and, if the polarity test current is smaller than the predefined threshold, it can be determined that the respective connection device contact should be connected to ground.

The detection test voltage and the polarity test voltage can be the same and also the detection test current and the polarity test current can be the same, i.e. the same test voltage and the resulting same test current can be used for detecting whether the electrical device contact has been connected to the connection device contact and for determining the polarity of the electrical device contact.

In a preferred embodiment the electrical device is assigned to a class of a number of classes of electrical devices, wherein the connection device comprises a class determination unit for determining the class of the electrical device, if the electrical device contact of the electrical device has been connected to the connection device contact, and a power conversion unit for converting the DC power of the DC power distribution system depending on the determined class of the electrical device. In this embodiment the power providing control unit is adapted to provide the converted DC power of the DC power distribution system to the connection device contact. This allows the system to provide the DC power in an adapted way, i.e. adapted to the respective electrical device, thereby further improving the performance of the DC power distribution system. Also in this embodiment the DC power of the DC power distribution system, i.e. in this case the converted DC power of the DC power distribution system, is provided to the connection device contact, only if the load presence detection unit has detected that the electrical device contact of the electrical device has been connected to the connection device contact, wherein the DC power, i.e. the converted DC power, is provided with the determined polarity.

It is further preferred that the class determination unit is adapted to apply a classification test voltage to the connection device contact, to measure a resulting classification test current and to classify the electrical device depending on the measured classification test current. This allows reliably classifying the electrical device in a technically relatively simple way. Preferentially, the classification test voltage is larger than the detection test voltage and the polarity test voltage. For instance, the classification test voltage may be 10 V and the detection test voltage and the polarity test voltage may be 5 V. In particular, the class determination unit can be adapted to apply voltage pulses to the connection device contact, especially short pulses of low voltage, for instance, 10 ms pulses of 10 V. Correspondingly, the class determination unit can be adapted to measure current pulses and to classify the electrical device based on the measured current pulses. The class determination unit can be adapted to classify the electrical device by comparing the measured current with one or several predefined currents, which correspond to predefined classes. For instance, the electrical device can have a classification resistor resulting in a certain classification test current, when applying the classification test voltage, wherein the class of the electrical device can be determined by comparing the classification test current with predefined classification currents.

The load presence detection unit, the polarity determining unit and the class determination unit can be integrated in the same unit, wherein this same unit can be adapted to apply a voltage to the connection device contact, measure the resulting current and determine whether the electrical device contact of the electrical device has been connected to the connection device contact, determine the polarity of the electrical device contact of the electrical device and classify the electrical device depending on the measured current. These determinations can be performed consecutively, i.e. firstly a first voltage, i.e. the test detection voltage, of, for instance, 5 V, can be applied, a resulting first current can be measured and based on the measured first current it can be determined whether the electrical device contact of the electrical device has been connected to the connection device contact of the connection device, and the polarity of the electrical device contact can also be determined from the measured first current. Then, a second voltage, i.e. the classification test voltage, of, for instance, 10 V, can be applied, a resulting second current can be measured and the class of the electrical device can be determined based on the measured second current.

In an embodiment the system further comprises the electrical device with the electrical device contact connected to the connection device contact, wherein the electrical device comprises a detection resistor for generating the detection test current, if the detection test voltage is applied to the connection device contact of the connection device, and a classification resistor for generating the classification test current, if the classification test voltage is applied to the connection device contact. The electrical device preferentially further comprises an electrical device control unit for controlling the electrical device, wherein the electrical device control unit is adapted to measure a voltage applied to the connection device contact, to determine whether the measured voltage is the detection test voltage or the classification test voltage and to connect the detection resistor to the electrical device contact, if the measured voltage is the detection test voltage, and to connect the classification resistor to the electrical device contact, if the measured voltage is the classification test voltage.

It is further preferred that the electrical device comprises a driver for driving an electrical load of the electrical device, the electrical load driven by the driver and an isolation switch for isolating the driver and the electrical load from the electrical device contact, if the detection test voltage or the classification test voltage has been measured.

The connection device may further comprise a power line communication (PLC) unit for allowing the connection device to send and/or receive PLC signals. Also the electrical device can comprise a PLC unit for sending and/or receiving PLC signals. Moreover, the connection device may comprise a mechanical fixing element for mechanically fixing the electrical device to the DC power distribution system. The mechanical fixing element is, for instance, a screw joint element, a bayonet joint element, a snap-in fastener element, et cetera.

In a preferred embodiment the electrical device comprises a suspended ceiling component to be hung from a ceiling, wherein an electrical load is attached to the suspended ceiling component, wherein the system further comprises a carrying element for carrying the suspended ceiling component when hanging from the ceiling, wherein the carrying element is adapted to also conduct DC power supplied by the power supply. The carrying element is preferentially a carrying cable. Preferentially several carrying elements are used for carrying a suspended ceiling element. The suspended ceiling element can comprise one or several light sources and can be regarded as being a lighting cloud. The system can comprise several of suspended ceiling components, in particular, several of the lighting clouds. Preferentially, the connection device is attached to the ceiling and electrically connected with the electrical device via the carrying element.

The connection device can be attached to the outside of the ceiling or it can be attached within the ceiling, i.e. it can be embedded in the ceiling. The ceiling is preferentially a concrete ceiling.

In a further aspect of the present invention a connection device for being used in a DC power distribution system as defined in claim 1 and for connecting an electrical device to the DC power distribution system, in order to provide DC power to the electrical device, is presented, wherein the connection device is unipolar and comprises:

a connection device contact to which an electrical device contact of the electrical device is to be connected, a load presence detection unit for detecting whether the electrical device contact of the electrical device has been connected to the connection device contact, a polarity determining unit for determining the polarity of the electrical device contact of the electrical device, a power providing control unit for providing the DC power of the DC power distribution system to the connection device contact, only if the load presence detection unit has detected that the electrical device of the electrical device has been connected to the connection device contact, and for providing the DC power with the determined polarity.

In a further aspect of the present invention an electrical device for being used in a DC power distribution system as defined in claim 1 and for being connected to the DC power distribution system via unipolar connection devices as defined in claim 12, in order to provide DC power to the electrical device, is presented, wherein the load presence detection unit of the respective connection device is adapted to apply a detection test voltage to the connection device contact of the respective connection device, to measure a resulting detection test current and to detect whether the electrical device has been connected to the connection device contact based on the measured detection test current, wherein the electrical device is assigned to a class of a number of classes of electrical devices, wherein the respective connection device comprises a class determination unit for determining the class of the electrical device, if the electrical device contact of the electrical device has been connected to the connection device contact, wherein the class determination unit is adapted to apply a classification test voltage to the connection device contact, to measure a resulting classification test current and to classify the electrical device depending on the measured classification test current, wherein the electrical device comprises:

an electrical device contact to be connected with the connection device contact of the respective connection device, a detection resistor for generating the detection test current, if the detection test voltage is applied to the connection device contact of the respective connection device, and a classification resistor for generating the classification test current, if the classification test voltage is applied to the connection device contact.

In a further aspect of the present invention a DC power providing method for providing DC power of a DC power distribution system as defined in claim 1 is presented, wherein the method comprises:

detecting whether an electrical device contact of an electrical device has been connected to the connection device contact of a unipolar connection device by the load presence detection unit, determining the polarity of the electrical device contact of the electrical device by a polarity determining unit, and providing the DC power of the DC power distribution system to the connection device contact, only if the load presence detection unit has detected that the electrical device contact of the electrical device has been connected to the connection device contact, by the power providing control unit, wherein the DC power is provided with the determined polarity.

In a further aspect of the present invention a computer program for providing DC power of a DC power distribution system as defined in claim 1 is presented, wherein the computer program comprises program code means for causing a system as defined in claim 1 to carry out the steps of the method as defined in claim 14, when the computer program is run on a computer controlling the system.

It shall be understood that the DC power distribution system of claim 1, the connection device of claim 12, the electrical device of claim 13, the DC power providing method of claim 14, and the computer program of claim 15 have similar and/or identical preferred embodiments, in particular, as defined in the dependent claims.

It shall be understood that a preferred embodiment of the invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
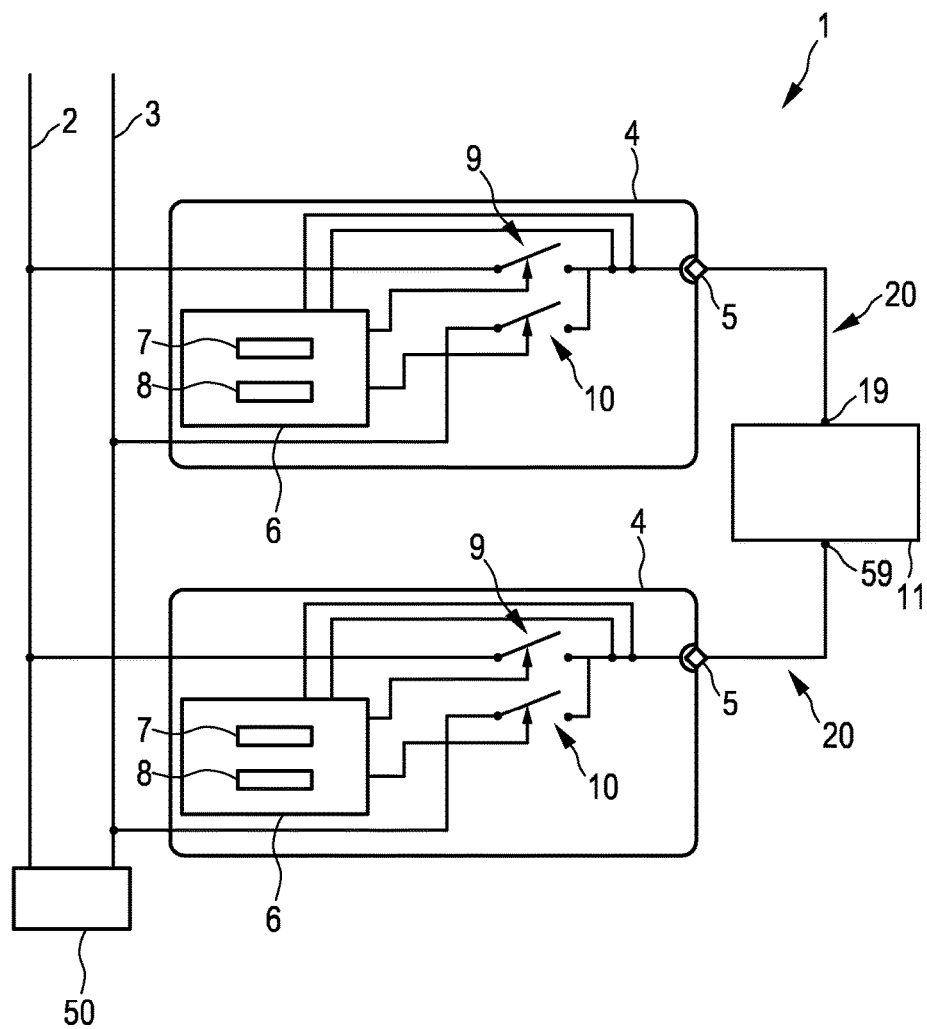
FIG. 1 shows schematically and exemplarily an embodiment of a DC power distribution system.

FIG. 1 shows schematically and exemplarily an embodiment of a DC power distribution system. The DC power distribution system 1 comprises a power supply 50 for supplying DC power to an electrical device 11. The system 1 further comprises connection devices 4 for electrically connecting the electrical device 11 to the power supply 50.

In this embodiment the power supply 50 comprises a power conversion unit for converting mains power received from a mains power supply (not shown) to DC power to be provided to the electrical device 11. In another embodiment the power supply 50 can also be another DC power supply.

The connection devices 4 are unipolar and comprise a connection device contact 5, to which an electrical device contact 19 or 59 of the electrical device 11 is connected via an electrical conductor 20, a load presence detection unit 7 for detecting whether the respective electrical device contact 19 or 59 of the electrical device 11 has been connected to the connection device contact 5, and a power providing control unit 6, 9, 10 for providing the DC power of the DC power distribution system to the connection device contact 5, only if the load presence detection unit 7 has detected that the respective electrical device contact 19 or 59 of the electrical device 11 has been connected to the connection device contact 5. In this embodiment the power providing control unit is formed by switches 9, 10 and a controller 6 for controlling the switches 9, 10. Moreover, in this embodiment the load presence detection unit 7 is integrated in the controller 6. The electrical conductor 20 can comprise a cable and/or another electrically conducting element, in particular, another metallic element, like an electrically conductive hook, a chain or a threaded rod, for example, a threaded rebar bolt, et cetera.

In this embodiment the electrical device 11 is a luminaire such that the DC power distribution system 1 with the connected luminaire 11 can be regarded as forming a lighting system, which may be installed at a ceiling of a room of a building. Although in FIG. 1 only one luminaire 11 connected to two connection devices 4 is schematically and exemplarily shown, the DC power distribution system can comprise more luminaires or other electrical devices like sensors, fans, et cetera and correspondingly more connection devices. The connection devices 4 can be embedded in the ceiling such that the connection device contacts 5 are still accessible, in order to allow the installer to connect the electrical devices to the connection device contacts 5.

The load presence detection unit 7 is adapted to apply a detection test voltage to the connection device contact 5, to measure a resulting detection test current and to detect whether the electrical device 11 has been connected to the connection device contact 5 based on the measured detection test current. In particular, the load presence detection unit 7 can be adapted to apply voltage pulses to the connection device contact 5, especially short pulses of low voltage, for instance, 10 ms pulses of 5 V. Correspondingly, the load presence detection unit 7 can be adapted to measure current pulses and to determine whether the electrical device 11 has been connected to the connection device contact 5 based on the measured current pulses. The load presence detection unit 7 can be adapted to detect whether the electrical device 11 has been connected to the respective connection device contact 5 by comparing the measured current with one or several predefined currents, which would be expected, if the electrical device 11 is connected to the respective connection device contact 5. For instance, the electrical device 11 can comprise an identification impendence resulting in a certain detection test current, when applying the test detection voltage, wherein it can be detected that the electrical device 11 has been connected, if the certain detection test current is measured.

The respective connection device 4 further comprises a polarity determining unit 8 for determining the polarity of the respective electrical device contact 19 of the electrical device 11 based on the measured detection test current, i.e. the detection test voltage may also be regarded as being a polarity test voltage and the detection test current may also be regarded as being a polarity test current. The polarity determining unit 8, which is also integrated with the controller 6, is adapted to determine the polarity of the respective electrical device contact 19, 59 of the electrical device 11 depending on whether the measured test current is positive or negative.

The DC power is provided to the connection devices 4 from the power supply 50 via electrical conductors 2, 3, which can be regarded as being bus bars. A first electrical conductor 2 carries a voltage of, for instance, 56 V and a second electrical conductor 3 is connected to ground. A first switch 9 selectively connects the first conductor 2 with the connection device contact 5 and a second switch 10 selectively connects the second electrical conductor 3 with the connection device contact 5. The switches 9, 10 are preferentially controlled by the controller 6 such that, when test voltages are applied to the connection device contact 5 and test currents are measured, the switches 9, 10 are open, i.e. the first and second electrical conductors 2, 3 are not electrically connected to the connection device contact 5. After it has been detected that the electrical device 11 is electrically connected to the respective connection device contact 5 and after the polarity of the respective electrical device contact 19, 59 connected to the respective connection device contact 5 has been determined, the controller 6 controls the switches 9, 10 such that the provided power corresponds to the respective determined polarity of the respective electrical device contact 19. Thus, for instance, in FIG. 1 the controller 6 may control the switches 9, 10 such that in the upper connection device 4 the first switch 9 is closed, i.e. conducting, and the second switch 10 is open, i.e. isolating, and in the lower connection device 4 the first switch 9 is open and the second switch 10 is closed. The power providing control unit formed by the controller 6 and the switches 9, 10 is therefore adapted such that the DC power is provided with the correct determined polarity.

In an idle state, i.e. in a state, in which the detection and polarity determination processes are not performed and in which an electrical device is not connected to a respective connection device contact, the respective connection device contact is connected to ground, in particular, low ohmic to ground. Thus, the controller 6 of the respective connection device 4 is adapted such that in this idle state the respective first switch 9 is open and the respective second switch 10 is closed. Connecting the respective connection device contact, which may also be regarded as being a contact node, to ground can have the benefit of low corrosion, of protection against ESD, of protection against electrical shocks, of being usable as a power drain, et cetera.

Thus, the connection devices can be operable in different states, i.e. in the idle state, in a scanning state, in which the detection and polarity determination processes are performed, and in a power providing state, in which the connection device contact of a connection device connected to one side of the electrical device is electrically connected to the first electrical conductor 2 carrying the voltage of, for instance, 56 V and the connection device contact of another connection device connected to another side of the electrical device is electrically connected to the second electrical conductor 3 being the ground conductor. If the connection device is in the idle state, the connection device enters the scanning state at predefined time intervals by opening the ground switch 10 and inserting the detection test voltage. The predetermined time intervals may be in the range of seconds, minutes or hours. For instance, the predetermined time intervals may be five seconds, one minute, five minutes, an hour et cetera. Preferentially, the connection devices are adapted such that they start the detection and polarity determination process independently of each other, wherein in this case the identification and polarity determination process works, if one of the connection devices 4 is in the scanning state and the other of the connection devices 4 is in the idle state. In order to reduce the probability that both connection devices are in their scanning states at the same time, the time intervals, in which the respective connection device is in the idle state, are preferentially relatively large in comparison to the time needed for a detection and polarity determination process in the scanning state.

If in the embodiment described above with reference to FIG. 1 the upper electrical device contact 19 is a positive contact, which should be connected to a positive pole, and the lower electrical device contact 59 is a negative contact, which should be connected to a negative pole, the lower connection device 4 electrically connected to the negative contact 59 experiences a negative test current, if the upper connection device 4 is in its scanning state. In this way the lower connection device 4 can detect that the upper connection device 4 is in its scanning state. The respective connection device 4 can be adapted such that it increases the time until it enters its scanning state, if it has detected that the other connection device connected to the electrical device 11 is in its scanning state. For instance, a pause timer of the respective connection device can be reset, if the connection device detects that the other connection device connected to the electrical device is in its scanning state.

Figure 2:
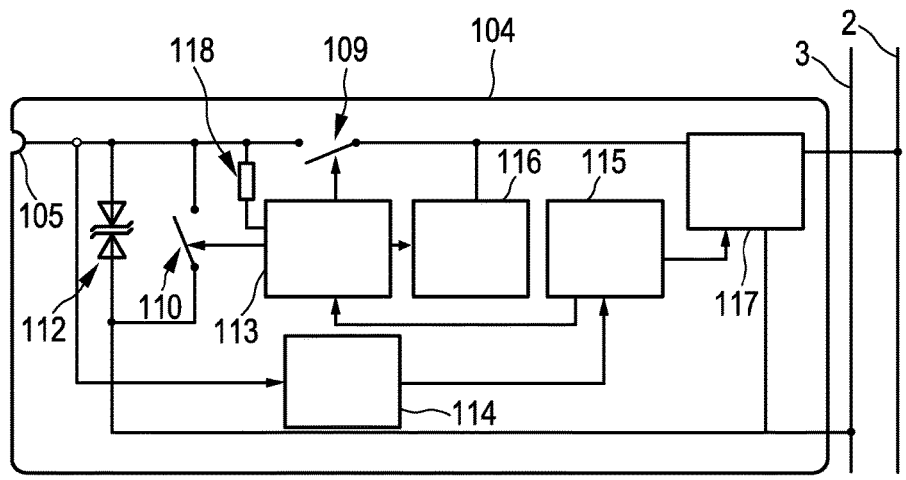
FIG. 2 shows schematically and exemplarily an embodiment of a connection device.
Figure 3:
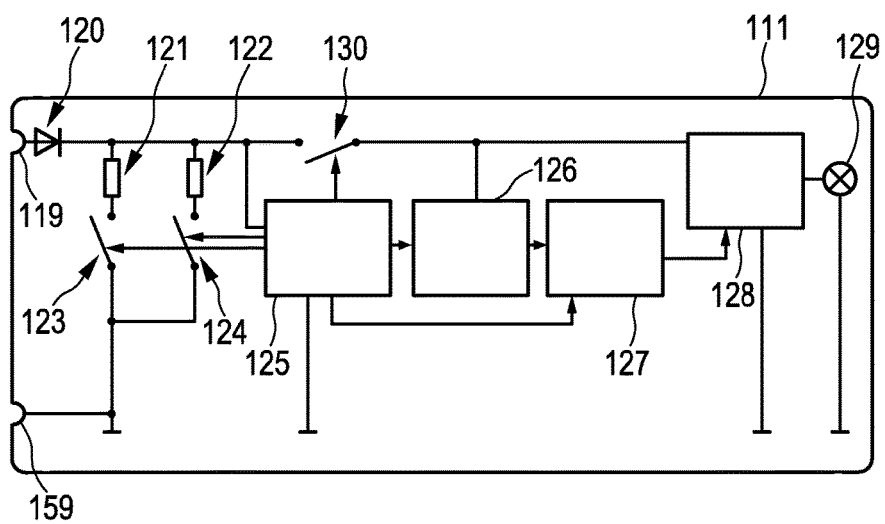
FIG. 3 shows schematically and exemplarily an embodiment of an electrical device.

FIGS. 2 and 3 schematically and exemplarily show further embodiments of a connection device and of an electrical device, which may be used in the system described above with reference to FIG. 1 instead of the connection devices 4 and the electrical device 11, respectively.

The connection device 104 schematically and exemplarily shown in FIG. 2 comprises a power conversion unit 117, a control unit 115, a PLC unit 116, a power-up sequencer 113 and a current measuring unit 114. The connection device 104 further comprises a first switch 109, a second switch 110, a resistor 118 and an overvoltage protection unit 112. The power-up sequencer 113, the current measuring unit 114 and the controller 115 are adapted to detect whether an electrical device contact 119, 159 of the electrical device 111 schematically and exemplarily shown in FIG. 3 has been connected to the connection device contact 105 of the connection device 104. Thus, in this embodiment the power-up sequencer 113, the current measuring unit 114 and the controller 115 form a load presence detection unit. In particular, the control unit 115 is adapted to control the power-up sequencer 113 such that a detection test voltage is applied to the connection device contact 105 via the resistor 118, which is connected to the upper electrical device contact 119. A resulting current can then be measured by the current measuring unit 114, wherein the measured current, i.e. the detection test current, is provided to the controller 115, which detects whether the electrical device 111 has been connected to the connection device contact 105 based on the measured detection test current. In this example the measured detection test current is positive, which allows the controller 115 to determine that the polarity of the electrical device contact 119 is positive. Thus, the power-up sequencer 113, the current measuring unit 114 and the control unit 115 also form a polarity determining unit for determining the polarity of the electrical device contact 119 of the electrical device 111. In this situation a detection test current measured by the connection device 104 connected to the lower electrical device contact 159 is negative such that the controller 115 of the connection device 104 connected to the lower electrical device contact 159 can determine that this connection device 104 is electrically connected to the negative side of the electrical device 111. In order to allow the connection device 104 connected to the lower electrical device contact 159 to determine that it is electrically connected to the negative side of the electrical device 111, it is adapted to measure a possible current in its idle state. Thus, in the idle state, in which the respective connection device is not actively scanning, it measures the current and can determine, if it is connected to the negative side of the electrical device 111. The controllers 115 of the connection devices 104 connected to the positive and negative sides of the electrical device 111 are further adapted to control the respective power-up sequencer to actuate the respective switches 109, 110 such that the DC power supplied via the electrical conductors 2, 3 is provided at the connection device contacts 105 of the connection device 104 with the correct polarity.

Thus, that the power providing control unit is adapted to provide the DC power of the DC power distribution system to the connection device contact, only if the load presence detection unit has detected that the electrical device contact of the electrical device has been connected to the connection device contact, means therefore in this embodiment that a first connection device connected to the positive side of the electrical device provides a positive voltage, while the negative side of the electrical device is connected to ground via the connection device connected to the negative side, only if the load presence detection unit has detected that the electrical device contacts at the positive and negative sides of the electrical device have been connected to the connection device contacts of the connection devices. Correspondingly, that the power providing control unit is adapted to provide the DC power with the determined polarity means that, if it has been determined that a certain side of the electrical device is the positive side and another side of the electrical device is the negative side, the positive side of the electrical device, i.e. the respective electrical device contact, is electrically connected to a connection device contact of a connection device applying a positive voltage and the negative side of the electrical device, i.e. the corresponding electrical device contact, is electrically connected to a connection device contact of a connection device connecting the negative side of the electrical device with ground.

Also in this example preferentially short pulses of low voltage are applied to the respective connection device contact 105, in particular, 10 ms pulses of 5 V may be applied to the connection device contact 105 for detecting whether the electrical device 111 has been connected and for determining the polarity of the respective electrical device contact 119, 159 connected to the respective connection device contact 105.

If in this example the connection device 104 electrically connected to the lower electrical device contact 159 applies a detection test voltage to its connection device contact 105, the connection device 104 will not see any reaction, i.e. will not monitor a detection test current, because the diode 120 will be in the backward direction and not conducting. Thus, the connection device 104 electrically connected to the lower electrical device contact 159 will again enter its idle state, i.e. the respective connection device contact will be connected to ground, after a reaction on the detection test voltage could not be measured.

In the embodiment described with reference to FIGS. 2 and 3 the electrical device contact 119 is the positive side of the electrical device 111 and the other electrical device contact 159 is the negative side of the electrical device 111. If the connection device 104 connected to the electrical device contact 119 is in its scanning state, i.e. if the connection device 104 connected to the electrical device contact 119 applies the test voltage to the electrical device contact 119, the connection device 104 electrically connected to the electrical device contact 119 measures a positive test current and the connection device 104 electrically connected to the electrical device contact 159 measures a negative test current. From the sign of the test current the connection device 104 electrically connected to the electrical device contact 119 knows that it is connected to the positive side of the electrical device 111 and the connection device 104 electrically connected to the electrical device contact 159 knows that it is electrically connected to the negative side of the electrical device 111. Thus, the polarity of the respective electrical device contact 119, 159 can be determined based on the sign of the test current measured by the respective connection device 104.

If in another embodiment the negative side of an electrical device is electrically connected to several connection devices, the test current will divide over all connection devices electrically connected to the negative side, i.e. to the corresponding electrical device contact. If the positive side of the electrical device is electrically connected to several connection devices and if these connection devices are tied together, the respective connection device that is actually in its scanning state will get short circuited by the other connection devices in grounding mode, which can be detected. If the connection devices connected to the positive side of the electrical device are electrically decoupled, for instance, by using diodes, each of these connection devices will generate a negative test current at the negative side of the electrical device, if they are in their scanning states, wherein this negative test current can be measured by one or several connection devices electrically connected to the negative side of the electrical device, i.e. electrically connected to the respective electrical device contact. These current measurements can be used for determining the polarity of the respective electrical device contact.

The electrical device 111 is assigned to a class, i.e. a power class, of a number of classes of electrical devices, wherein the power-up sequencer 113, the current measuring unit 114 and the controller 115 are adapted to determine the class of the electrical device 111, if the respective electrical device contact 119, 159 of the electrical device 111 has been connected to the connection device contact 105. In particular, if the controller 115 of a connection device 104 has determined that the connection device 104 is electrically connected to the electrical device contact 119 at the positive side of the electrical device 111, the controller 115 controls the power-up sequencer 113 to apply a classification test voltage to the connection device contact 105, wherein the current measuring unit 114 measures the resulting classification test current and wherein the controller 115 classifies the electrical device 111 depending on the measured classification test current. The power-up sequencer 113, the current measuring unit 114 and the controller 115 form therefore a class determination unit for determining the class of the electrical device 111. Since the power-up sequencer 113, the current measuring unit 114 and the controller 115 are also adapted to detect whether the electrical device contact 119 has been connected to the connection device contact 105 and to determine the polarity of the electrical device contact 119 connected to the connection device contact 105, in this embodiment the same units are used for detecting whether the respective electrical device contact 119 has been connected to the connection device contact 105, for determining the polarity of the connected electrical device contact 119 and for determining the class of the electrical device 111. These detection and determination steps can be performed consecutively, i.e. firstly the test detection voltage of, for instance, 5 V can be applied, a resulting first current can be measured and based on the measured first current it can be determined whether the respective electrical device contact 119 of the electrical device 111 has been connected to the connection device contact 105 of the connection device 104, and the polarity of the respective electrical device contact 119, can also be determined from the measured first current. Then, the classification test voltage of, for instance, 10 V can be applied, a resulting second current can be measured and the class of the electrical device 111 can be determined based on the measured second current. The detection and classification test voltages are preferentially applied in the scanning state of the connection device 104.

If the connection device 104 connected to the electrical device contact 119 at the positive side of the electrical device 111 performs the classification procedure, the connection device 104 connected to the electrical device contact 159 at the negative side of the electrical device 111 can measure the classification test current, without actively applying a voltage to its connection device contact. Since the connection device connected to the electrical device contact 159 at the negative side of the electrical device 111 can measure the classification test current, it knows that it can enter the power providing state and leave the idle state, wherein in this example in the power providing state the connection device 104 electrically connected to the electrical device contact 159 at the negative side of the electrical device 111 will connect this electrical device contact 159 to ground. In this example the main difference between the power providing state, in which the connection device contact electrically connected to the negative side of the electrical device 111 is connected to ground, and the idle state, in which this connection device contact is also connected to ground, is that in the idle state the connection device 104 performs electrical device detection procedures at predetermined time intervals, i.e. in the idle state the connection device 104 enters the scanning state at predetermined time intervals, whereas in the power providing state the connection device electrically connected to the electrical device contact 159 at the negative side of the electrical device 111 will constantly connect the connection device contact to ground, as long as the negative side of the electrical device 111 is electrically connected to the connection device contact of the connection device.

Thus, if the connection devices 104 are electrically connected to the electrical device contacts 119, 159 at the positive and negative sides of the electrical device 111, the connection device 104 connected to the positive side will measure a positive current and the connection device 104 connected to the negative side will measure a negative current. As long as the connection devices 104 measure this current, they will not go into their idle states and will not start scanning at predefined time intervals. However, if such a current is not measured and a connection device 104 is in its idle state, at predetermined time intervals the respective connection device 104 will enter the scanning state and start a scanning procedure with applying the test detection voltage to the connection device contact.

In the idle state, when the respective connection device 104 is not in its intermittent scanning state, the connection device contact of the connection device 104 is connected to ground, i.e. for instance, in FIGS. 1 and 2 the switches 10, 110 are closed, i.e. conducting, whereas the switches 9, 109 are open, i.e. isolating. If a connection device gets connected to the positive side of an electrical device, in the scanning state the connection device will detect the detection test current, determine that it is connected to the positive side of the electrical device and sequence through the classification procedure. Finally, the connection device enters the power providing state, in which the voltage is supplied, i.e. for instance in which the switch 9 or the switch 109 is closed, whereas the switch 10 or 110, respectively, is opened, is made isolating.

While the respective connection device is in its power providing state, current is measured and the connection device remains in its operational mode, which may also be regarded as being a positive or negative supply mode, until the measured current falls below a certain predetermined lower threshold. This falling below the lower threshold may indicate that the electrical device has been removed. In this situation the respective connection device enters its idle state again. The connection device may be adapted to wait a predetermined waiting time before changing from the power providing state to the idle state, in order to allow an electrical device to run in a low power standby mode, while consuming some current to keep the positive supply active.

The connection device newly connected to a negative side of an electrical device will in its scanning state not detect that it is connected to the electrical device. However, when the connection device connected to the positive side of the electrical device is in its scanning state, the connection device connected to the negative side of the electrical device will monitor in its idle state a negative current and enter its power providing state, in which its connection device contact is connected to ground, wherein in the power providing state no repeating scan cycles are performed in contrast to the idle state. The connection device connected to the negative side of the electrical device remains in its power providing state, which may also be regarded as being a negative supply state, until the measured current is below the predetermined lower threshold, in particular, until no current is measured, for a predetermined waiting time of, for instance, one minute. If this is the case, the connection device connected to the negative side of the electrical device will enter its idle state again, wherein the idle state is repeatedly interrupted by the scanning state at predetermined time intervals.

Also the classification test voltage can be applied in pulses. For instance, 10 ms pulses of 10 V can be applied, wherein the resulting current pulses can be measured and used to classify the electrical device 111. The class determination unit, in particular, the controller 115, can be adapted to classify the electrical device 111 by comparing the measured current with one or several predefined currents, which correspond to predefined classes. In particular, in this embodiment the electrical device 111 comprises a classification resistor 122 resulting in a certain classification test current, when applying the test classification voltage, wherein the class of the electrical device 111 can be determined by comparing this classification test current with predefined classification currents. The connection device 104 further comprises a power conversion unit 117 for converting the DC power of the DC power distribution system depending on the determined class of the electrical device 111.

After the detection, polarity determination and classification procedures have been completed, the power-up sequencer 113 at least of the connection device 104 connected to the positive side of the electrical device can activate the PLC unit 116. Also the PLC unit 126 of the electrical device 111 can be activated, after the detection, polarity determination and classification procedures have been completed. Thus, after the detection, polarity determination and classification procedures have been completed, at least the connection device connected to the positive side of the electrical device 111 and the electrical device 111 may exchange PLC commands. Since the PLC units 116, 126 are preferentially not active during the detection, polarity determination and classification procedures, PLC commands cannot disturb the detection, polarity determination and classification procedures. Moreover, since the PLC units 116, 126 are only activated, if the detection, polarity determination and classification procedures have been completed, the energy consumption and conducted and radiated emissions (EMI) can be reduced.

The PLC communication can be used to set appropriate power conditions, i.e. the PLC communication allows for detailed power negotiations. For instance, the PLC communication process can start with a standard power of, for instance, 5 V with a maximum current of 2 A. This standard power can be used to start the power negotiations, in order to provide a certain desired power. For instance, via the PLC communication the electrical device can request a certain final voltage. Also other power/voltage/current related information may be communicated by using the PLC units like information about the power maximally available from the respective connection device.

The overvoltage protection device 112 is arranged in parallel to the second switch 110, i.e. to the ground switch 110, in order to protect the circuit for ESD or a similar kind of overload situations. The switches 109, 110 and also the other switches mentioned in the embodiments can be relays, semiconductor switches, et cetera.

The electrical device 111 schematically and exemplarily shown in FIG. 3 comprises a power-up sequencer 125, a PLC unit 126, a controller 127, a driver 128 and an electrical load 129 being, in this embodiment, a light source. The electrical device 111 further comprises a first switch 123, a second switch 124 and a third switch 130, and a detection resistor 121 and a classification resistor 122. Moreover, a diode 120 is connected to the upper electrical device contact 119 on the positive side of the electrical device 111.

The power-up sequencer 125 is adapted to measure the voltage applied to the upper electrical device contact 119 in FIG. 3 and to determine whether the measured voltage is a detection test voltage or a classification test voltage. If the measured voltage is the detection test voltage, the power-up sequencer closes the first switch 123 such that it is conducting and opens the second switch 124 such that it is isolating, thereby generating the detection test current by using the detection resistor 121. If the measured voltage is the test classification voltage, the power-up sequencer 125 opens the first switch 123 such that it is isolating and closes the second switch 124 such that it is conducting, in order to generate the classification test current by using the classification resistor 122. Thus, the power-up sequencer 125 and the switches 123, 124 can be regarded as forming an electrical device control unit being adapted to measure a voltage applied to the connection device contact 105 of the connection device 104, to determine whether the measured voltage is the detection test voltage or the classification test voltage and to connect the detection resistor 121 to the upper electrical device contact 119, if the measured voltage is the detection test voltage, and to connect the classification resistor 122 to the upper electrical device contact 119, if the measured voltage is the classification test voltage.

During the detection and classification procedures the power-up sequencer 125 ensures that the third switch 130 is open, i.e. isolating, in order to isolate the driver 128 from the electrical device contact 119, especially if the internal impedance of the driver 128 is similar to or lower than the impedance of the detection resistor 121 and of the classification resistor 122. After the detection and classification procedures have been completed and the power-up sequencer 125 measures an operational voltage of, for instance, 56 V, the power-up sequencer 125 closes the third switch 130, which may also be regarded as being an isolation switch, such that this switch is conducting and opens the first and second switches 123, 124 such that they are isolating. Moreover, the power-up sequencer then informs the PLC unit 126 and the controller 127 that they can enter an operational mode, in which the PLC unit 126 can receive PLC commands being indicative of a desired dim level of the light source 129, wherein the controller 127 is adapted to provide control signals to the driver 128, which are indicative of the dim level defined by the PLC commands. The driver 128 then drives the light source 129 in accordance with the dim level indicated by the control signals.

Thus, the circuit of the electrical device 111 schematically and exemplarily shown in FIG. 3 has a detection resistor 121, which may also be regarded as being an identification resistor, which is apparent when the detection test voltage is applied, i.e. when a detection pulse, which may also be regarded as being an identification pulse, is asserted. The detection test voltage may be, for instance, 5 V. The detection resistor 121 is switchable, in order to reduce power consumption in the powered mode. The power-up sequencer 125 preferentially comprises comparators for distinguishing the detection test voltage, i.e. in this embodiment a detection pulse voltage of, for instance, 5 V, from the classification test voltage being, for instance, 10 V, wherein the power-up sequencer 125 operates the related switches 123, 124, whenever these voltages appear, to show the requested impedances. When operation voltage is applied, the isolation switch 130 may be closed and the other switches 123, 124 may be opened.

The circuitry used for performing the detection, polarity determination and classification procedures, in particular, the circuitry comprising the detection and classification resistors 121, 122, the switches 123, 124 and the power-up sequencer 125, may be adapted to use the test current for powering purposes, i.e. this circuitry may be powered by the injected test current. Thus, preferentially the electrical device does not comprise a separate supply for powering this circuitry during the detection, polarity determination and classification procedure and the identification impedance, i.e. the detection resistor 121 is preferentially configured such that enough power is available for the intermitted supply of the detection, polarity determination and classification functions. The implementation of the detection, polarity determination and classification procedures is therefore a low power implementation that can be powered by the injected test current.

Different classes of electrical devices are exemplarily shown in following table:

| Class | Classification impedance | Classification test current | Requested Voltage |
|---|---|---|---|
| 1 | 25 kΩ | 0.4 mA | 10 V |
| 2 | 10 kΩ | 1 mA | 12 V |
| 3 | 5 kΩ | 2 mA | 24 V |
| 4 | 2.5 kΩ | 4 mA | 48 V |
| 5 | 1 kΩ | 10 mA | 56 V |

In this table in the first column the different classes are identified, in the second column the different classification impedances corresponding to the different classes are shown, in the third column the classification test currents obtained with a classification test voltage of 10 V are listed and in the fourth column the respective voltages requested by the electrical devices of the respective class are mentioned. In accordance with this table, if, for instance, the classification resistor 122 has an impedance of 5 kΩ, the power-up sequencer 113 of the connection device 104 measures a classification test current of 2 mA, whereupon the controller 115 controls the power conversion unit 117 such that a nominal voltage of 24 V is applied to the connection device contact 105. Thus, the classification impedance can be used for programming the requested voltage/current/power level.

Figure 4:
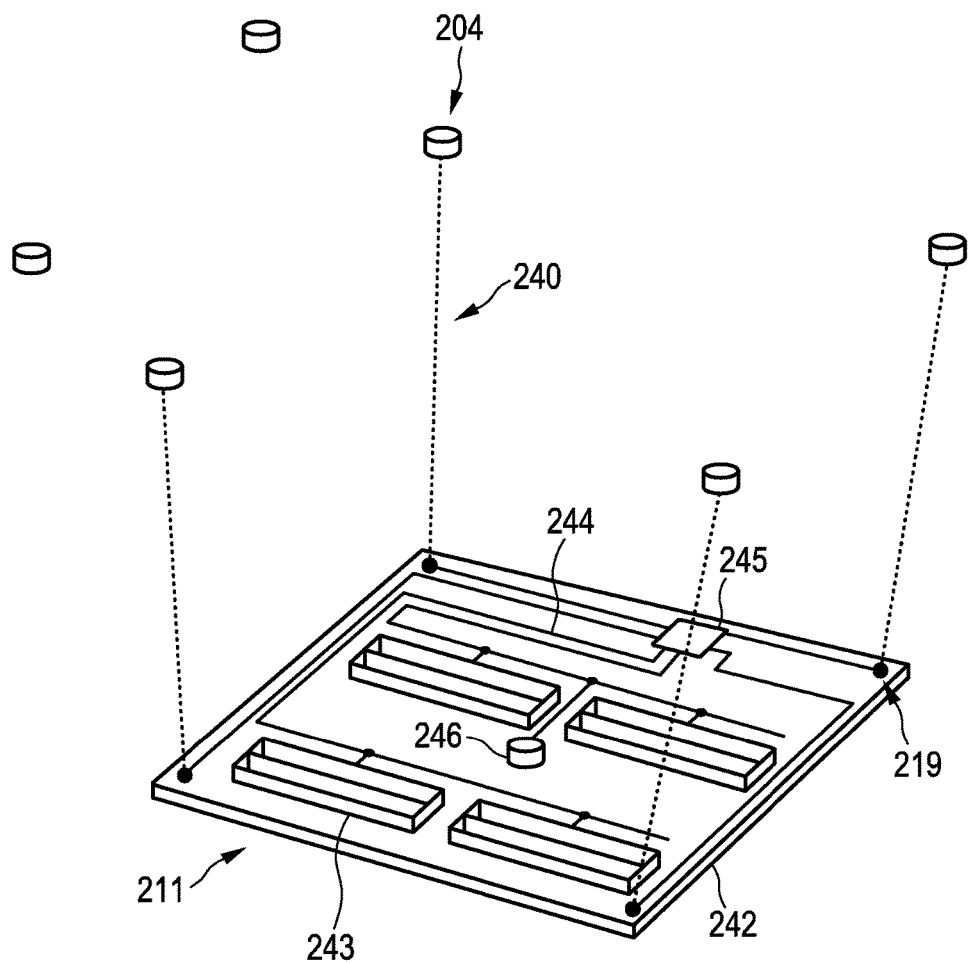
FIG. 4 shows schematically and exemplarily an embodiment of a lighting cloud.

In an embodiment the electrical device can comprise a suspended ceiling component as schematically and exemplarily illustrated in FIG. 4. In this embodiment the electrical device 211 comprises a suspended ceiling component 242 to be hung from a ceiling, wherein luminaires 243 and a sensor 242 are mounted on the suspended ceiling component 242 for forming a lighting cloud. In particular, the suspended ceiling component 242 can be a plate, on which the luminaires 243 and the sensor 242 are arranged. The sensor 242 and the luminaires 243 are connected via electrical conductors 244 with a controller 245. The luminaires 243 and the sensor 242 are arranged on openings in the suspended ceiling component 242 such that a room can be illuminated by the luminaires 243 and the room can be sensed by the sensor 242. In particular, the sensor 242 may be a presence detection sensor for detecting the presence of persons in the room, wherein the sensor 246 and the luminaires 243 are adapted such that the luminaires 243 are switched on, if the sensor 246 detects the presence of persons in the room.

The electrical device 211 is attached to the ceiling by using connection devices 204, which are arranged in a pattern at the ceiling and which can also be regarded as being power joints, and carrying elements 240. The carrying elements 240 are adapted to carry the suspended ceiling component 242 and to also conduct DC power provided by the connection devices 204. The carrying elements 204 are adapted to connect electrical device contacts 219 with connection device contacts of the connection devices 204. Also the connection devices 204 comprise integrated load presence detection units for detecting whether the respective electrical device contact 219 of the electrical device 211 has been connected to the connection device contact of the respective connection device and a power providing control unit for providing the DC power of a DC power distribution system, to which the connection devices 204 are connected and which is integrated in the ceiling (not shown), to the respective connection device contact, only if the respective load presence detection unit has detected that the respective electrical device contact 219 of the electrical device 211 has been connected to the respective connection device contact. The load presence detection unit and the power providing control unit of the respective connection device 204 can be implemented as described in above mentioned embodiments, i.e. the connection devices 204 can comprises circuitry as described above with reference to, for instance, FIG. 2. The provided DC power is fed to the luminaires 213 and the sensor 246 via the controller 245. The controller 245 may be adapted to measure a voltage applied to a respective connection device contact of the respective connection device 204, to determine if the measured voltage is a detection test voltage or a classification test voltage and to connect a detection resistor to the respective electrical device contact 219, if the measured voltage is the detection test voltage, and to connect a classification resistor to the respective electrical device contact 219, if the measured voltage is the classification test voltage. Thus, the controller 245 can be adapted to provide the functions described above with reference to, for instance, FIG. 3, i.e. it can comprise circuitry as described above with reference to FIG. 3. Correspondingly, the connection devices 204 can also comprise a class determination unit and a power conversion unit as described above with reference to, for instance, FIG. 2.

The controller 245 may be adapted for power line or wireless communication, in order to allow a user to control the controller 245 via a remote control. Moreover, in this embodiment each power joint formed by a respective connection device 204 may be adapted to conduct minus or plus of the DC power supply.

Figure 5:
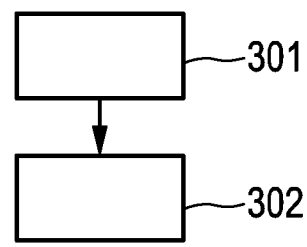
FIG. 5 shows a flowchart exemplarily illustrating an embodiment and of a DC power providing method for providing DC power of a DC power distribution system.

In the following an embodiment of a DC power providing method for providing DC power of a DC power distribution system will exemplarily be described with reference to a flowchart shown in FIG. 5.

In step 301 the load presence detection unit of the connection device detects whether an electrical device contact of an electrical device has been connected to a connection device contact of the connection device. In step 302 the power providing control unit provides the DC power of the DC power distribution system to the connection device contact, only if the load presence detection unit has detected that the electrical device contact of the electrical device has been connected to the connection device contact, by the power providing control unit.

A problem in known DC power distribution systems is connecting the electrical devices with correct polarity. A further problem are unused connection points, i.e. unused contacts to which an electrical device could be contacted, because they are powered, which leads to corrosion of the contacts and to the possibility of installers getting electrified. In case of embedded connection points, which may also be regarded as being connection joints, i.e. connection points being embedded in a ceiling or in another part of a room, these might be accessible even during building erection. These problem can be solved by using the above described connection devices as the connection points.

The connection device preferentially comprises a control module including at least a load presence detection unit, a polarity determining unit and a power providing control unit for allowing a connection of the respective electrical device contact to one pole of the DC power distribution system depending on the detected electrical device presence and the polarity detection. The DC power distribution system with the connection devices allows therefore connecting DC electrical devices with undefined polarity to separate connection devices, i.e. to separate connection points. These connection points are not powered as long as no electrical device is connected. An electrical device is preferentially identified by means of a small measurement voltage, i.e. the detection test voltage. Also the polarity of the electrical device is preferentially detected and the respective connection point may get switched through to the DC power supply with correct polarity, whenever a compatible electrical device is found.

The connection device is preferentially adapted to apply short pulses of low voltage during the scanning state, i.e. to apply the detection test voltage. The current is then measured and used to determine a potentially connected detection impedance, which may also be regarded as being an identification impedance. If the detection impedance of, for instance, 25 kΩ against ground is found by measuring a corresponding detection test current, the power-up sequence is preferentially started, because a compatible electrical device has been identified. The respective ground connectors of the electrical device can be identified, because these carry the negative detection test current pulse. The connection device can be further adapted to determine the number of ground connections in parallel based on the amplitude of the detection test current pulse.

The DC power distribution system can further comprise a power managing unit, which may be integrated in one of the components of the DC power distribution system like the power supply, the electrical device consuming the power, a connection device, et cetera, or which may be a separate unit. The power managing unit is preferentially adapted to be in communication with the connection devices of the DC power distribution system, in order to supervise the connection devices, wherein the power managing unit may be adapted to collect power related information from the connection devices and calculate how much power is made available. The power managing unit can be adapted to make sure that even in an overload situation fuses do not blow, but that instead some electrical devices, for instance, some luminaires, are operated with a lower power or get disabled. The power managing unit can therefore be used to provide a managing of an available power budget for guaranteeing failure safe operation. The power managing unit can also be adapted for managing the power supply in another way. For instance, if a certain electrical device has a higher priority than other electrical devices, the power managing unit can be adapted such that the electrical device having the higher priority surely gets a certain power level such that, if the overall power consumption needs to be reduced, the power provided to the other electrical devices is reduced, but not the power provided to the electrical device having the high priority. The electrical device having the high priority might be, for instance, a freezing room, in which the temperature should not be larger than a predefined maximum temperature.

The power-up sequence can be similar to the power-up in Power-over-Ethernet applications. Thus, as described above, a classification impedance can be used for determining the class, i.e. the power class, of the connected electrical device, wherein then the corresponding power can be provided.

In an embodiment the connection device may be adapted to apply a certain voltage to its connection device contact, if it has been detected, that an electrical device has been connected to the connection device contact, but if the detection test current is unknown. Thus, in this case a certain voltage may be applied to the connection device contact without any further identification. This voltage of, for instance, 5 V is preferentially provided with a maximum power and may be used, for instance, for allowing public charging or for other purposes.

The connection device can be adapted to determine whether it can support the requested voltage, current or power, respectively, which may be requested by the actual power class of the actual electrical device, wherein, if the connection device cannot support the requested voltage, current or power, respectively, the connection device can refuse going into a power-up mode.

The connection device and the electrical device may be adapted to allow PLC, in order to set appropriate power conditions.

The connection devices can be adapted to also function as a mechanical fixing element for mechanically fixing the electrical device to the DC power distribution system. For instance, the connection device can be adapted to provide a mechanical fixing solution based on screws, bayonet connectors, rings and hooks including carabiners, press button fasteners, snap-in fasteners, et cetera.

Although in above described embodiments the connection devices, i.e. the power joints, are located at a ceiling of a room, in other embodiments the connection devices can also be arranged at other locations. For instance, they can be arranged in public spaces, where the connection devices are freely accessible, wherein in an outdoor application they may be integrated, for instance, in the pavement, in order to connect electrical devices at the pavement. The connection devices can also be integrated in tent hooks or in poles or walls, wherein a lamp may hang between the poles or walls, respectively. The connection devices can comprise mechanical fixing elements such that in multipurpose halls, for instance, exhibition pavilions can be mechanically fixed and powered via the connection devices. The connection devices can form a grid of contacts for automatic power and polarity setting.

Although in above described embodiments a classification procedure has been described, which is based on certain classification impedances and classification test currents, in other embodiments the classification procedure can also be based on other classification impedances and classification test currents.

In order to allow the connection device to detect, if the connection device contact has accidentally been connected to ground, for instance, to protective ground of a building, or to a connection device contact of another connection device, the connection devices can comprise a series resistor resulting in a defined test detection current, if the detection test voltage is applied to the respective connection device contact. For instance, the series resistor can have an impedance of 250Ω such that the connection device can determine that it is connected to ground or to another connection device, if the test detection current is 20 mA, wherein in this example the detection test voltage is 5 V. Thus, by measuring a test detection current of 20 mA it can be detected whether the respective connection device contact is short circuited by being connected to another ground connecting connection device or directly to ground. If such an accidental connection has been detected, this may be indicated to a user like an installer, in order to allow the user to correctly connect the connection device. The connection device may therefore comprise an output unit like a light source, for instance, a light emitting diode, for indicating an incorrect connection.

If the connection device is adapted to manage the power budget, this is preferentially performed such that it is guaranteed that the DC power distribution system does not overload.

Moreover, the connection devices can be adapted to measure the current, the voltage and/or the power and switch off the power provision, if the respective measured electrical value is larger than a corresponding threshold, in order to provide an overpower protection. In particular, the connection device can be adapted to measure the current during normal operation, i.e. after power-up, wherein, if the measured current is larger than a threshold, for instance, due to short circuits or other failures, the power provision to the respective electrical device may be switched off.

The connection devices of the DC power distribution system are preferentially adapted such that the electrical device can be freely connected to two or more of the connection devices, i.e. to the power joints. Furthermore, the connection devices are preferentially adapted such that all outer electrically conducting surfaces of the respective connection device, which are accessible, when the electrical device has been connected to the connection device, are covered with an insulating material, for reducing the likelihood of an electrification of a person and for sealing against corrosion.

Although in above described embodiments to the positive side of an electrical device a first connection device is connected and to a negative side of the electrical device a second connection device is connected, in other embodiments to the same side, i.e., for instance, to the same electrical device contact, several connection devices can be connected. If this is the case, the connection devices connected to the same side of the electrical device can be controlled such that current balancing is provided, i.e. that all connection devices connected to the same side of the electrical device provide the same electrical current. In order to control the current provided by a connection device the power conversion unit 117 described above with reference to FIG. 2 or the switch 109 also described above with reference to FIG. 2 may be controlled accordingly. If a switch is used for controlling the current provided by a connection device, the switch may be in a linear mode or may be controlled by means of pulse width modulation, in order to limit the provided current. In order to perform the current balancing, the connection devices connected to the same side of the electrical device preferentially communicate to each other, for example, via the PLC units 116 or via another communication system. Also an external controlling unit, for instance, the above described power managing unit, may be used to perform the current balancing, wherein in this case the external controlling unit may receive from the different connection devices information being indicative of the current provided by the respective connection device and the controlling unit may send controlling signals to the connection devices for controlling the current provided by the respective connection device such that the current is balanced between the different connection devices. Also in this case PLC or another communication system can be used.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Procedures like the detection whether the electrical device contact of the electrical device has been connected to a connection device contact, the provision of the DC power, only if it has been detected that the electrical device contact has been connected to the connection device contact, the determination of the polarity, the classification, et cetera performed by one or several units or devices can be performed by any other number of units or devices. These procedures and/or the control of the DC power distribution system in accordance with the DC power providing method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a DC power distribution system comprising a power supply for supplying DC power to an electrical device like a luminaire, wherein the system includes a connection device comprising a connection device contact to which an electrical device contact of the electrical device is to be connected, a load presence detection unit for detecting whether the electrical device contact has been connected, and a power providing control unit for providing the DC power of the DC power distribution system to the connection device contact, only if the load presence detection unit has detected that the electrical device contact of the electrical device has been connected to the connection device contact. Thus, a voltage is not applied to the connection device contact, if the electrical device is not connected, thereby reducing corrosion effects and the likelihood of installers getting electrified.

The invention claimed is:

1. A DC power distribution system comprising a power supply for supplying DC power to an electrical device, wherein the system includes unipolar connection devices for electrically connecting the electrical device to the power supply, wherein a unipolar connection device comprises:

a connection device contact to which an electrical device contact of the electrical device is to be connected,
a load presence detector configured to detect whether the electrical device contact of the electrical device has been connected to the connection device contact,
a polarity tester configured to determine a polarity of the electrical device contact of the electrical device,
a controller configured to provide the DC power of the DC power distribution system to the connection device contact, only if the load presence detector has detected that the electrical device contact of the electrical device has been connected to the connection device contact, and to provide the DC power with the polarity as determined by the polarity tester.

2. The system as defined in claim 1, wherein the load presence detector is adapted to apply a detection test voltage to the connection device contact to measure a resulting detection test current and to detect whether the electrical device has been connected to the connection device contact; based on the measured detection test current.

3. The system as defined in claim 1, wherein the polarity tester is adapted to measure a polarity test current and to determine the polarity of the electrical device contact of the electrical device depending on the measured polarity test current.

4. The system as defined in claim 3, wherein the polarity tester is adapted to apply a polarity test voltage to the connection device contact and to measure the polarity test current, when the polarity test voltage is applied.

5. The system as defined in claim 1, wherein the electrical device is assigned to a class of a number of classes of electrical devices, wherein the controller is configured to determine the class of the electrical device, if the electrical device contact of the electrical device has been connected to the connection device contact, and the connection device further comprises a power converter configured to convert the DC power of the DC power distribution system depending on the determined class of the electrical device.

6. The system as defined in claim 5, wherein the controller is adapted to apply a classification test voltage to the connection device contact, to measure a resulting classification test current and to classify the electrical device depending on the measured classification test current.

7. The system as defined in claim 1, wherein the load detector is adapted to apply a detection test voltage to the connection device contact, to measure a resulting detection test current and to detect whether the electrical device has been connected to the connection device contact based on the measured detection test current, the electrical device is assigned to a class of a number of classes of electrical devices, wherein the controller is configured to determine the class of the electrical device, if the electrical device contact has been connected to connection device contact wherein the controller is adapted to apply a classification test voltage to the connection device contact to measure a resulting classification test current and to classify the electrical device depending on the measured classification test current, the system further comprises the electrical device with the electrical device contact connected to the connection device contact, wherein the electrical device comprises a detection resistor for generating the detection test current, if the detection test voltage is applied to the connection device contact, and a classification resistor for generating the classification test current, if the classification test voltage is applied to the connection device contact.

8. The system as defined in claim 7, wherein the electrical device further comprises an electrical device control circuitry configured to control operation of the electrical device, wherein the electrical device control circuitry is adapted to measure a voltage applied to the connection device contact to determine whether the measured voltage is the detection test voltage or the classification test voltage and to connect the detection resistor to the electrical device contact if the measured voltage is the detection test voltage, and to connect the classification resistor to the electrical device contact if the measured voltage is the classification test voltage.

9. The system as defined in claim 8, wherein the electrical device further comprises:
   a driver for driving an electrical load of the electrical device,
   the electrical load driven by the driver,
   an isolation switch for isolating the driver and the electrical load from the electrical device contact if the detection test voltage or the classification test voltage has been measured.

10. The system as defined in claim 1, wherein the connection device further comprises a power line communication adapter configured to enable the connection device to send and/or receive power line communication signals.

11. The system as defined in claim 1, wherein the electrical device comprises a suspended ceiling component to be hung from a ceiling, wherein an electrical load is attached to the suspended ceiling component wherein the system further comprises a carrying element for carrying the suspended ceiling component when hanging from the ceiling, wherein the carrying element is adapted to also conduct DC power supplied by the power supply.

12. A connection device for being used in a DC power distribution system and for connecting an electrical device to the DC power distribution system, in order to provide DC power to the electrical device, the connection device being unipolar and comprising:
   a connection device contact to which an electrical device contact of the electrical device is to be connected,
   a load presence detector configured to detect whether the electrical device contact of the electrical device has been connected to the connection device contact,
   a polarity tester configured to determine the polarity of the electrical device contact of the electrical device,
   a controller configured to provide the DC power of the DC power distribution system to the connection device contact, only if the load presence detector has detected that the electrical device contact of the electrical device has been connected to the connection device contact, and to provide the DC power with the determined polarity.

13. A method for providing DC power of a DC power distribution system, the method comprising:
   detecting whether an electrical device contact of an electrical device has been connected to the connection device contact of a unipolar connection device,
   determining the polarity of the electrical device contact of the electrical device, and
   providing the DC power of the DC power distribution system to the connection device contact only if it has been detected in the detecting step that the electrical device contact of the electrical device has been connected to the connection device contact, wherein the DC power is provided with the polarity determined in the determining step.

14. A computer program for providing DC power of a DC power distribution system, the computer program comprising program code means for causing the system to carry out the steps of a method, the method comprising:
   detecting whether an electrical device contact of an electrical device has been connected to the connection device contact of a unipolar connection device,
   determining the polarity of the electrical device contact of the electrical device, and
   providing the DC power of the DC power distribution system to the connection device contact, only if it has been detected in the detecting step that the electrical device contact of the electrical device has been connected to the connection device contact, wherein the DC power is provided with the polarity determined in the determining step.

* * * * *